United States Patent [19]

Nelson et al.

[11] Patent Number: 5,536,549
[45] Date of Patent: Jul. 16, 1996

[54] AUSTENITIC STAINLESS STEEL SUBSTRATE FOR MAGNETIC-RECORDING MEDIA

[75] Inventors: Carl W. Nelson, Hayward; Richard D. Weir; Richard S. Weir, both of Agoura Hills, all of Calif.

[73] Assignee: Tulip Memory Systems, Inc., Fremont, Calif.

[21] Appl. No.: 101,546

[22] Filed: Aug. 2, 1993

[51] Int. Cl.$^6$ .......................... C23C 14/00; G11B 5/66; G11B 5/70; B32B 3/02

[52] U.S. Cl. ............. 428/65.3; 204/192.1; 204/192.11; 204/192.2; 427/129; 428/336; 428/694 T; 428/694 TS; 428/694 ST; 428/900

[58] Field of Search .................... 420/43; 428/694 T, 428/694 TS, 694 ST, 694 SG, 64, 65, 900, 611, 627, 685, 686, 579, 698, 693, 65.3, 64.2, 336; 427/129, 131, 121; 204/192.1, 192.11, 192.12, 192.2

[56] References Cited

U.S. PATENT DOCUMENTS

| | | | |
|---|---|---|---|
| 3,607,528 | 9/1971 | Gassaway | 156/230 |
| 3,784,402 | 1/1974 | Reedy, Jr. | 117/69 |
| 3,912,461 | 10/1975 | Wakefield | 29/195 |
| 4,390,601 | 6/1983 | Ono et al. | 428/412 |
| 4,407,880 | 10/1983 | Terao et al. | 428/156 |
| 4,743,491 | 5/1988 | Asada et al. | 428/213 |
| 4,876,117 | 10/1989 | Bornstein | 427/130 |
| 4,922,462 | 5/1990 | Ikegawa et al. | 365/113 |
| 5,051,287 | 9/1991 | Yamada et al. | 428/65.6 |
| 5,126,179 | 6/1992 | Inagaki | 428/65.6 |
| 5,131,995 | 7/1992 | Suenaga et al. | 204/192.16 |
| 5,204,192 | 4/1993 | Nakamura et al. | 428/694 R |
| 5,389,418 | 2/1995 | Ota et al. | 428/65.3 |

FOREIGN PATENT DOCUMENTS

| | | |
|---|---|---|
| 59217225 | 7/1984 | European Pat. Off. . |
| 59148129 | 8/1984 | European Pat. Off. . |
| 62128021 | 8/1987 | European Pat. Off. . |
| 62219322 | 9/1987 | European Pat. Off. . |
| 62243115 | 10/1987 | European Pat. Off. . |
| 61-199224 | 1/1987 | Japan . |

OTHER PUBLICATIONS

Thornton, "Influence Of Apparatus Geometry And Deposition Conditions On The Structure and Topography Of Thick Sputtered Coatings", J. Vac. Sci. Technol., vol. 11, No. 4, Jul./Aug. 1974; pp. 666–670.

Grube et al., "High-Rate Carburizing In A Glow-Discharge Methane Plasma", Metallurgical Transactions A, vol. 9A, Oct. 1978; pp. 1421–1429.

Braganza, et al., "Nitriding Of Metals And Interaction Of The Nitrides With A Low Pressure Hydrogen Plasma".

Korhonen, et al. "Plasma Nitriding And Ion Plating With An Intensified Glow Discharge", Thin Solid Film 107(1983), pp. 387–395.

Hoffman, et al., "Microstructural Control Of Plasma-Sputtered Refractory Coatings", Handbook of Plasma Processing Technology, pp. 483–517.

Krauss, "Steels: Heat Treatment And Processing Principles", ASM International, Materials Park, Ohio (1990), pp. 319–349.

(List continued on next page.)

Primary Examiner—Paul Thibodeau
Assistant Examiner—Stephen Sand
Attorney, Agent, or Firm—Limbach & Limbach

[57] ABSTRACT

An improved magnetic-recording disk and a process for manufacturing magnetic-recording disks are disclosed. A precision cold-rolled austenitic stainless steel is the substrate for a magnetic-recording disk. The surface of the substrate may be hardened by plasma nitriding, plasma carburizing, or plasma carbonitriding. A hard coating may be applied to the substrate by evaporative reactive ion plating or reactive sputtering of aluminum nitride, silicon nitride, silicon carbide, or nitrides, carbides, or borides of titanium, zirconium, hafnium, vanadium, niobium, tantalum, chromium, molybdenum, or tungsten.

13 Claims, 1 Drawing Sheet

OTHER PUBLICATIONS

Bell, et al., "Plasma Surface Engineering" from International Seminar on Plasma Heat Treatment, Science And Technology held in France, Sep. 1987; pp. 13–53.

Dexter, et al., "The Physical And Chemical Processes Of Vacuum And Glow Discharge Carburising" from International Seminar on Plasma Heat Treatment, Science And Technology, France, Sep. 1987; pp. 58–71.

Edenhofer, et al., "Industrial Processes, Applications And Benefits Of Plasma Heat Treatment" from International Seminar on Plasma Heat Treatment, Science And Technology, France, Sep. 1987; pp. 399–415.

Konuma, "Film Deposition By Plasma Techniques" 1992; pp. 184–215.

5,536,549

AUSTENITIC STAINLESS STEEL SUBSTRATE FOR MAGNETIC-RECORDING MEDIA

BACKGROUND OF THE INVENTION

1. Field of the Invention

This invention relates generally to magnetic-recording disks, and relates more particularly to an austenitic stainless steel substrate for application of magnetic-recording media.

2. Description of the Relevant Art

In a disk file, the most common recording medium is a very flat and smooth aluminum-alloy substrate disk having both of its surfaces coated with a magnetic-recording material such as a ferrimagnetic or ferromagnetic oxide powder dispersed in a resin binder or a plated or sputter-deposited thin film of ferromagnetic cobalt alloy.

Typically, an aluminum-alloy substrate of a magnetic-recording disk has surfaces that are either diamond tool turned on a lathe or ground by a surface grinder. These machined surfaces result in matte finishes. Alternatively, substrate disks may be precision blanked from flat precision cold-rolled aluminum-alloy sheet or other metal strip whose surface finish would replicate that of the work rolls used in the finishing pass of the rolling mill. For example, with work rolls that have been ground and polished to a mirror-bright finish, a metal strip with a mirror-bright surface finish would result.

Aluminum is a soft metal and, therefore, can be damaged by a read/write head impacting the disk too forcefully. To provide for protection against defects caused by impacts of a read/write head, an aluminum-alloy substrate is typically first coated with a hard, nonmagnetic material before the magnetic-recording material is applied. A nickel-phosphorus alloy, electroless-deposited from an aqueous solution, is the hard material commonly used for this application. In order for this protective plating to adhere properly to the surface of an aluminum-alloy substrate, a zincate solution is used to dissolve the surface aluminum oxides, hydroxyoxides, and hydrous oxides, and to provide a zinc metal layer by replacement reaction. After coating, the surface of the nickel-phosphorus-alloy-coated disk is extensively lapped and polished to provide a flat and smooth surface for the application of the magnetic layer. This lapping and polishing step is expensive and adds substantial costs to the final disk product.

Apart from the need to lap and polish the disk after application of the nickel-phosphorus alloy, the application of this hard coating presents additional difficulties. For example, it is extremely difficult to obtain flaw-free electroless-deposited nickel-phosphorus-alloy coatings. Nodules, pits, and bumps occur in these coatings and such defects cause recording errors.

Another problem is that the electroless-deposited nickel-phosphorus alloy is very prone to recrystallization upon heating, where the nonmagnetic (actually, superparamagnetic) single phase of nickel and phosphorus separates into two equilibrium crystalline phases, namely, nickel, which is ferromagnetic, and nickel phosphide. The resulting ferromagnetism renders the media useless for the magnetic-recording application.

Moreover, such a disk is also subject to warpage upon heating because of stress concentrations at the coating-substrate interface. This warpage also renders the media useless.

Another problem associated with the use of an aluminum alloy as a substrate includes added cost for time and labor involved in its processing. Furthermore, entire disks can be rendered useless through myriad heat-related effects.

SUMMARY OF THE INVENTION

In accordance with the illustrated preferred embodiment, the present invention provides an improved magnetic-recording disk and a process for manufacturing magnetic-recording disks. A hard, flat disk of austenitic stainless steel is the substrate for a magnetic-recording disk. Conventional magnetic-recording materials may be applied to the surfaces of the austenitic stainless steel disk substrate either directly or after first surface-hardening or hard-coating the substrate.

One aspect of the present invention is to provide a substrate precision blanked from flat precision cold-rolled austenitic stainless steel strip.

Another aspect of the present invention is to harden the surface region of the austenitic stainless steel substrate by a hardening treatment prior to application of the magnetic-coating material. The process used for the hardening treatment can be plasma nitriding, plasma carburizing, or plasma carbonitriding.

Yet another aspect of the present invention is to apply a hard coating to the surface of the austenitic stainless steel substrate as an alternative to or in addition to the surface-hardening treatment. The application of the hard coating is done by evaporative reactive ion plating or reactive sputtering of a hard material selected from the group consisting of aluminum nitride, silicon nitride, silicon carbide, and nitrides, carbides, and borides of titanium, zirconium, hafnium, vanadium, niobium, tantalum, chromium, molybdenum, or tungsten.

A significant advantage of the present invention is that it provides a flat, hard substrate for the deposition of magnetic-recording materials. The present invention reduces the costs involved in the manufacture of magnetic-recording disks in both materials costs and waste costs by eliminating the deposition of nickel-phosphorus alloy.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENTS

Figure 1:
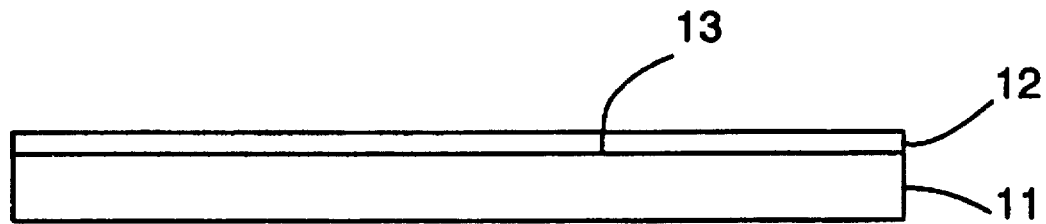
FIG. 1 is a side view of an austenitic stainless steel substrate of the present invention with a layer of magnetic-recording media applied directly to the substrate, with or without a prior surface hardening of the substrate. This and other figures herein are not to scale.
Figure 2:
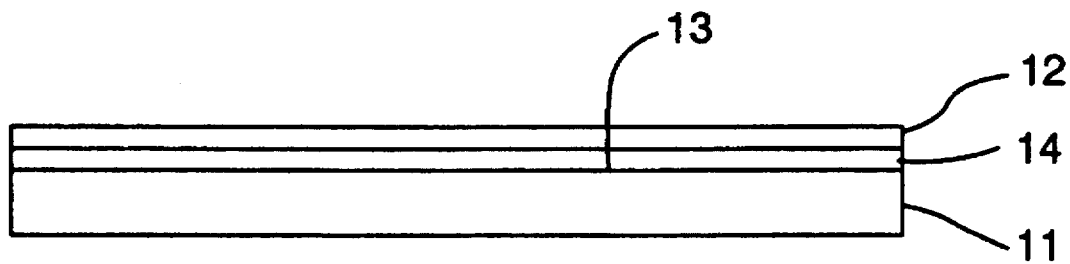
FIG. 2 is a side view of an austenitic stainless steel substrate of the present invention with a hard coating applied to the substrate prior to deposition of a layer of magnetic-recording media.

FIGS. 1 and 2 of the drawings and the following description depict various preferred embodiments of the present invention for purposes of illustration only. One skilled in the art will readily recognize from the following discussion that alternative embodiments of the structures and methods illustrated herein may be employed without departing from the principles of the invention described herein. While the invention will be described in conjunction with the preferred embodiments, it will be understood that they are not intended to limit the invention to those embodiments. On the contrary, the invention is intended to cover alternatives, modifications, and equivalents, which may be included within the spirit and scope of the invention as defined by the claims.

The present invention provides low-cost, high-performance substrates for magnetic-recording applications by providing a substrate disk from precision-rolled strip of a suitable austenitic stainless steel. Accordingly, the present invention obviates the need for the costly and troublesome electroless-deposited nickel-phosphorus-alloy coating, which is otherwise required on an aluminum-alloy disk substrate.

Since the surface finish of the precision-rolled strip becomes a contact negative of the work-roll finish, used in the last pass of the mill, the smoother the surface finish of the last-pass work rolls, the smaller is the amount of lapping and polishing required for the substrate disk. Subsequently, both surfaces of the austenitic stainless steel substrate disk can be appropriately textured to give a circumferential scratch pattern. This intentional surface roughening serves simultaneously two desirable purposes: 1) tribologically, to minimize stiction and friction at the head-to-disk interface; and 2) on the subsequently sputter-deposited films of the chromium (or chromiumalloy) underlayer and the cobalt-alloy magnetic layer, to provide preferred orientation of the crystallites along the circumferential texture lines in the substrate plane. For the case of the application of a hard coating prior to the deposition of the magnetic media, the texturing of the disk substrate surfaces by an abrasive tape or slurry should be more severe (the peak-to-valley heights greater) than ordinarily in order to compensate for the extraordinary levelizing effect obtained in the coatings characteristic of the energetic-atom-deposited dense fibrous Zone T structure (as shown on the Movchan-Demchishin-Thornton zone-structure diagram) where the energy involved per depositing atom is sufficiently high. References on the subject of coating zone structures include the following: J. A. Thornton, J. Vac. Sci. Technol. 11, 666 (1974); D. W. Hoffman and R. C. McCune in "Handbook of Plasma Processing Technology", S. M. Rossnagel, J. J. Cuomo, and W. D. Westwood, eds., Ch. 21, pp. 483–517, Noyes Publications, Park Ridge, N.J. (1990).

As shown in FIG. 1, onto a properly surface-finished substrate disk 11 made of an austenitic stainless steel, a coating of magnetic-recording media 12, composed of chromium (or chromium alloy) and cobalt-alloy double-layer thin films, is directly applied by sputter deposition. While the magnetic-recording media 12 is shown applied to only one surface of the disk substrate 11, of course it is conventional and within the scope of the present invention to coat both surfaces of the substrate with magnetic-recording media. FIG. 1 and the rest of the figures herein are not to scale. The magnetic-recording media 12 is any conventional ferromagnetic or ferrimagnetic material and is capable of being magnetized by application of an external magnetic field.

The surface region 13 of the austenitic stainless steel substrate 11 can be modified to the depth of several micrometers (as much as 100 µm) by a hardening treatment prior to the deposition of the magnetic-recording media 12. The hardening treatment is preferably either plasma nitriding, plasma carburizing, or plasma carbonitriding.

The plasma surface-hardening treatment of the austenitic stainless steel disk substrates can be accomplished in the same system designed for evaporative ion plating and described in U.S. patent application Ser. No. 07/771,348, filed Oct. 4, 1991 by the instant inventors, which disclosure is hereby incorporated by reference. This system contains an electrically isolated cantilevered drum planetary substrate holder in which six equispaced planet gears, each with its cantilevered shaft, rotate around a nonrotating sun gear, causing the drum housing to also rotate around the sun gear. The disk substrates through the inside diameter are mounted on (and in electrical contact with) the cantilevered shafts so that they are equispaced along each shaft length. In this way both sides of the disk substrates are simultaneously exposed to the gas discharge. Since the drum planetary and the disk substrates when powered are all at the same bias potential, a quasi-hollow cathode is formed by each facing pair of disk substrates. This multi-quasi-hollow-cathode configuration, when high-radiofrequency powered, results in a gas discharge of high plasma density permitting, for a given power density, substantially higher bombarding-ion current densities and lower voltages to be obtained at low pressures in comparison with the well-known single high-radiofrequency-powered-planar-disk-diode configuration.

In plasma nitriding, energetic nitrogen atoms (some of which had been energetic nitrogen ions) from the dissociation of nitrogen molecules in the gas discharge adsorb on the sputter-etch-cleaned surface of the steel, diffuse inward at temperatures of 370° to 500° C., and hardening is accomplished by the precipitation of veryfine interstitial alloy nitride grains in the diffusion zone.

Prior to beginning the plasma surface-hardening treatment, the disk substrates (along with the planetary substrate holder) are sputter-etch cleaned by means of, first, an air gas discharge operated anywhere in the pressure range of 40 Pa (300 mtorr) to 400 Pa (3.0 torr) and at a developed dc bias voltage whose magnitude is less than −30 V, measured with respect to ground, from the high-radiofrequency (13.56 MHz) power coupled to the planetary. The air glow-discharge cleaning selectively and rapidly removes carbonaceous substances and organic contaminants such as oils, greases, and waxes by converting them into volatile gases ($CO$, $CO_2$, and $H_2O$) which are pumped away. Furthermore, this air gas discharge provides an extremely effective method for efficiently heating the disk substrates by means of the heat input delivered not only by the low-voltage bombarding ions but also by the surface recombination of energetic excited neutral atoms to form molecules. If desired, a gas mixture of oxygen and nitrogen can be used instead of air.

Subsequently, the oxides on the disk substrate surface are hydrogen reduced to the metallic state by means of energetic atom and ion bombardment by hydrogen and argon atoms and ions from a hydrogen-argon gas-mixture discharge operated anywhere in the pressure range of 40 Pa (300 mtorr) to 400 Pa (3.0 torr) and at a developed dc bias voltage whose magnitude is greater than −30 V, measured with respect to ground, from the 13.56 MHz rf power coupled to the planetary. Interestingly, if triode assistance in the form of thermionic hot-tungsten-filament cathodes is provided in this process, for a given negative dc bias voltage (typically −20 V) on the filament array and a given 13.56 MHz rf power coupled to the planetary, the magnitude of the developed dc bias voltage (and hence the bombarding-ion energy)

on the planetary and its substrates can be increased by increasing the amount of thermionically emitted electrons. (Electron emission is controlled by adjusting the temperature of the filament with more electrons being emitted by increasing the 50 or 60 Hz ac heating current through the filament.) This behavior observed over the pressure range of 40 Pa (300 mtorr) to 400 Pa (3.0 torr) is opposite to that of the normal triode sputtering source operated over the pressure range of 0.1 Pa (0.75 mtorr) to 2 Pa (15 mtorr). Furthermore, the filament array depending on its proximity to the disk substrates can provide heating of these substrates in addition to that delivered from the energetic ion bombardment by both argon and hydrogen ions and from the surface recombination of energetic excited hydrogen atoms to form hydrogen molecules.

After sufficient time has elapsed to free the disk substrate surfaces of oxides and to sufficiently heat the substrates, nitrogen is introduced to the gas discharge. Various gases or gas-mixture combinations can be used, as follows: 1) nitrogen and hydrogen; 2) nitrogen, hydrogen, and argon; 3) ammonia; 4) ammonia and argon. Since the former two discharges generate ammonia, and the latter two discharges generate nitrogen and hydrogen, they are essentially equivalent in effect. The plasma-nitriding surface-hardening treatment of the substrates can take place anywhere in the pressure range of 40 Pa (300 mtorr) to 400 Pa (3.0 torr). Alternatively, if triode assistance as described above is provided, then pressures as low as 1.0 Pa (7.5 mtorr) to 4.0 Pa (30 mtorr) can be employed.

In an analogous way, the plasma-carburizing surface-hardening treatment of the substrates can be accomplished with the substitution of a hydrocarbon gas, such as methane, for nitrogen or ammonia. For the case of plasma carbonitriding, then a hydrocarbon gas, such as methane, is added to the nitrogen- or ammonia-containing gas mixture.

Since carbonaceous substances and surface oxides on the substrates act as diffusion barriers to the energetic nitrogen and carbon atoms adsorbed from the glow-discharge plasma nitriding, carburizing, or carbonitriding process, it is essential that glow-discharge sputter-etch cleaning of the substrates and plasma hydrogen reduction of the surface oxides take place prior to the plasma surface-hardening treatment. The plasma, in the presence of a nitriding or carburizing gas, increases the mass transfer of nitrogen or carbon atoms, respectively, to the substrate surface in comparison with conventional gas nitriding or carburizing methods. Case depth is still largely controlled by solid-state diffusion of nitrogen and/or carbon atoms in the austenitic stainless steel to form fine-grain precipitates of interstitial alloy nitrides, carbides, or carbonitrides, correspondingly, a time-temperature-dependent process which proceeds independently of the plasma.

References on the subject of plasma nitriding, plasma carburizing, and plasma carbonitriding include the following:

T. Bell and P. A. Dearnley, "Plasma Surface Engineering" in "Plasma Heat Treatment Science and Technology", PYC Edition, Paris, France (1987), pp. 13–53.

B. Edenhofer, M. H. Jacobs, and G. N. George, "Industrial Processes, Applications and Benefits of Plasma Heat Treatment", in "Plasma Heat Treatment, Science and Technology", PYC Edition, Paris, France (1987), pp. 399–415.

A. C. Dexter, T. Farrell, M. I. Lees, and B. J. Taylor, "The Physical and Chemical Processes of Vacuum and Glow-Discharge Carburizing", in "Plasma Heat Treatment, Science and Technology", PYC Edition, Paris, France (1987), pp. 58–71.

W. L. Grube and J. G. Gay, "High-Rate Carburizing in a Glow-Discharge Methane Plasma", Met. Trans. A 91, 1421 (1978).

A. S. Korhonen, E. H. Sirvio, and M. S. Sulonen, Thin Solid Films 107, 387 (1983).

G. Krauss, "Steels: Heat Treatment and Processing Principles", ASM International, Materials Park, Ohio (1990), pp. 319–325.

As shown in FIG. 2, a 0.5 to 1.0 µm thickness, or other appropriate thickness, layer 14 of a hard coating may be applied prior to the deposition of the magnetic-recording media 12. The hard coating is selected from the group consisting of aluminum nitride, silicon nitride, silicon carbide, and nitrides, carbides, and borides of titanium, zirconium, hafnium, vanadium, niobium, tantalum, chromium, molybdenum, or tungsten, and can be directly deposited on the austenitic stainless steel substrate 11 by evaporative reactive ion plating or by reactive sputtering. Such a hard coating has been disclosed in U.S. patent application Ser. No. 07/771,348, filed Oct. 4, 1991 by the instant inventors, which disclosure is hereby incorporated by reference. Preferably, the magnetic-recording media 12 is comprised of chromium (or chromium-alloy) and cobalt-alloy thin-film layers.

In addition, the surface region 13 of the austenitic stainless steel substrate 11 can be hardened to the depth of several micrometers (as much as 100 µm) by plasma nitriding, plasma carburizing, or plasma carbonitriding, and then a 0.5 to 1.0 µm thickness, or other appropriate thickness, layer of a hard coating selected from the group consisting of aluminum nitride, silicon nitride, silicon carbide, and nitrides, carbides, and borides of titanium, zirconium, hafnium, vanadium, niobium, tantalum, chromium, molybdenum, or tungsten can be deposited on this hardened surface of this austenitic stainless steel substrate by evaporative reactive ion plating or by reactive sputtering prior to the sputter deposition of the magnetic-recording media 12.

The direct deposition of magnetic media onto an austenitic stainless steel disk substrate is the lowest cost substitute for an electroless-deposited-nickel-phosphorus-alloy-coated aluminum-alloy disk substrate. Since the hardnesses of sufficiently work-hardened austenitic stainless steel and electroless nickel are similar, the disk performance would be essentially the same. With austenitic stainless steel, however, the inherent limitations and the fabrications problems of electroless nickel are avoided.

The plasma surface-hardening treatment of austenitic stainless steel substrates can provide a substantially higher hardness, a Vickers microhardness of 1100 to 1200 kg/mm². Accordingly, the disk performance would be improved over the above in terms of head impacts upon the disk during operation of the drive. Some additional processing cost is involved because of the plasma treatment over that of an untreated and uncoated austenitic stainless steel substrate.

The deposition of a hard coating onto the austenitic stainless steel substrates can provide still higher hardness, a Vickers microhardness of 2000 to 3000 kg/mm². Consequently, an even more rugged disk is the result, but with further additional processing cost.

Properly processed austenitic stainless steels are truly single phase, without carbides, ferritic, martensitic, or other phases, and with all alloying elements in solid solution. The austenitic phase is nonmagnetic (strictly, paramagnetic) whereas the ferritic and martensitic phases are ferromagnetic up to the Curie temperature, and above which they are paramagnetic. The alloying elements which stabilize the body-centered-cubic structure of iron, the ferritic and closely related martensitic forms, are chromium, molybdenum, tungsten, vanadium, silicon, and aluminum, and those which stabilize the face-centered-cubic structure of iron, the austenitic form, are nickel, manganese, carbon, and nitrogen. The austenitic stainless steels having a higher content of nickel, manganese, or nickel plus manganese with respect to a given chromium content above the required minimum are very stable, and do not form any deformation-induced martensitic phase during work hardening. These austenitic stainless steels designated by their Unified Numbering System (UNS) alloy numbers include S30452, S30500, S31000, S31600, S31603, S31700, S31703, S38400, S20910, S21000, S21300, S21904, S24100, S28200, S66286, N08020, N08024, N08026, N08366, and N08367, with S31600 and S31603 being very widely available.

The austenitic stainless steel UNS S20910 provides a combination of desirable properties not found in any other commercial material in its price range. This alloy in its corrosion resistance surpasses even that of those austenitic stainless steels noted for this characteristic, namely Type 316 (UNS S31600), Type 316L (UNS S31603), Type 317 (UNS S31700), and Type 317L (UNS S31703), plus this alloy in the annealed condition has 1.8 times greater yield strength at room temperature than that of the aforementioned alloys. UNS S20910, too, remains completely nonmagnetic (actually, paramagnetic) after severe cold work. In addition, the alloy's high work-hardening rate can be used to advantage when cold working to increase strength. This alloy works hardens with less cold reduction to higher strength and displays greater ductility at any given strength level than the usual austenitic stainless steels. In this respect, UNS S20910 is most similar to Type 301 (UNS S30100). UNS S20910 is defined as having composition that includes substantially 0.06% C, 4.0–6.0% Mn, 1.00% Si, 20.5–23.5% Cr, 11.5–13.5% Ni, 0.04% P, 0.03% S, 1.5–3.0% Mo, 0.2–0.4% N, 0.1–0.3% V. [Source: "Metals Handbook Desk Reference", ASM International].

Type 301 stainless steel (UNS S30100) in the well-annealed condition is fully austenitic and thus is nonmagnetic (paramagnetic); however, it becomes slightly magnetic with cold work due to the deformation-induced formation of some martensitic phase which is ferromagnetic. This slight increase in magnetic permeability may not be troublesome for the magnetic-recording application. However, this behavior can be completely avoided by the selection of the above-mentioned alloys.

The austenitic stainless steel UNS S20910 was developed by and is available from Armco, Inc., and is marketed by Armco as NITRONIC 50 stainless steel. Other companies such as Carpenter Technology Corporation, Crucible Materials Corporation, and AL Tech Specialty Steel Corporation sell UNS S20910 as 22-13-5 (XM-19) stainless steel.

The following comparison chart for some physical and mechanical properties of austenitic stainless steels UNS S31600 (Type 316) and UNS S20910 shows that the latter has a significant advantage in strength over the former. Essentially, UNS S20910 combines the best features of UNS S30100 (Type 301) and UNS S31600 (Type 316).

TABLE 1

Comparison of some physical and mechanical properties of austenitic stainless steels UNS S31600 (Type 316) and UNS S20910

|  | UNS S31600 (Type 316) | UNS S20910 |
|---|---|---|
| Density | 7.95 g/cm$^3$ | 7.88 g/cm$^3$ |
| Electrical resistivity | 74 μohm cm | 82 μohm cm |
| Thermal-expansion coefficient |  |  |
| (20 to 100° C.) | 16.0 × 10$^{-6}$ cm/cm/°C. | 16.2 × 10$^{-6}$ cm/cm/°C. |
| (0 to 650° C.) | 18.5 × 10$^{-6}$ cm/cm/°C. | 18.9 × 10$^{-6}$ cm/cm/°C. |
| Melting point range | 1370 to 1400° C. | 1370 to 1400° C. |
| Modulus of elasticity (Young's) | 28,000 kpsi 193 GPa | 28,000 kpsi 193 GPa |
| Ultimate tensile strength |  |  |
| annealed | 82,000 psi 565 MPa | 120,000 psi 827 MPa |
| 20% work hardened | 113,000 psi 779 MPa | 172,500 psi 1189 MPa |
| 40% work hardened | 150,000 psi 1034 MPa | 205,500 psi 1417 MPa |
| Yield strength 0.2% |  |  |
| annealed | 36,000 psi 248 MPa | 65,000 psi 448 MPa |
| 20% work hardened | 70,000 psi 483 MPa | 150,000 psi 1034 MPa |
| 40% work hardened | 111,000 psi 765 MPa | 185,000 psi 1276 MPa |

Currently, the 5086 aluminum-magnesium alloy (UNS A95086) is very widely used for disk substrates by the magnetic-recording industry. The following comparison chart for some physical and mechanical properties of the 5086 aluminum alloy (UNS A95086) and the high-strength austenitic stainless steel UNS S20910 shows that, with the exception of density, the latter has several advantages over the former.

TABLE 2

Comparison of some physical and mechanical properties of 5086 aluminum alloy (UNS A95086) and austenitic stainless steel UNS S20910

|  | Aluminum alloy UNS A95086 | Stainless steel UNS S20910 |
|---|---|---|
| Density | 2.66 g/cm$^3$ | 7.88 g/cm$^3$ |
| Electrical resistivity | 5.48 μohm cm | 82 μohm cm |
| Thermal-expansion coefficient |  |  |
| (20 to 100° C.) | 23.8 × 10$^{-6}$ cm/cm/°C. | 16.2 × 10$^{-6}$ cm/cm/°C. |
| (0 to 650° C.) |  | 18.9 × 10$^{-6}$ cm/cm/°C. |
| Melting point range | 585 to 640° C. | 1370 to 1400° C. |
| Modulus of elasticity (Young's) | 10,300 kpsi 71 GPa | 28,000 kpsi 193 GPa |
| Ultimate tensile strength |  |  |
| annealed | 38,000 psi 262 MPa | 120,000 psi 827 MPa |
| 20% work hardened | 42,000 psi 290 MPa | 172,500 psi 1189 MPa |
| 40% work hardened | 47,000 psi 324 MPa | 205,500 psi 1417 MPa |

TABLE 2-continued

Comparison of some physical and mechanical properties of 5086 aluminum alloy (UNS A95086) and austenitic stainless steel UNS S20910

|  | Aluminum alloy UNS A95086 | Stainless steel UNS S20910 |
|---|---|---|
| Yield strength 0.2% |  |  |
| annealed | 17,000 psi | 65,000 psi |
|  | 117 MPa | 448 MPa |
| 20% work hardened | 30,000 psi | 150,000 psi |
|  | 207 MPa | 1034 MPa |
| 40% work hardened | 37,000 psi | 185,000 psi |
|  | 225 MPa | 1276 MPa |

More significantly, the strength-to-density ratios of these two materials, each in the annealed condition, are nearly equal with a slight advantage to the stainless steel. This advantage of the stainless steel in strength-to-density ratio over the aluminum alloy becomes increasingly greater with increasing work hardening.

The following ratio-comparison chart for these properties of the austenitic stainless steels UNS S31600 (Type 316) and UNS S20910, each with respect to those of the 5086 aluminum alloy (UNS A95086), clearly illustrates the high-strength advantage of the latter stainless steel.

TABLE 3

Ratio property comparison of austenitic stainless steels UNS S31600 (Type 316) and UNS S20910, each with respect to 5086 aluminum alloy (UNS A95086)

|  | UNS S31600 | UNS S20910 |
|---|---|---|
| Density | 2.99 times | 2.96 times |
| Electrical resistivity (20° C.) | 13.50 times | 14.96 times |
| Thermal-expansion coefficient (20 to 100° C.) | 0.67 times | 0.68 times |
| Modulus of elasticity (Young's) | 2.72 times | 2.72 times |
| Ultimate tensile strength |  |  |
| annealed condition | 2.16 times | 3.16 times |
| 20% work hardened | 2.69 times | 4.11 times |
| 40% work hardened | 3.19 times | 4.37 times |
| Yield strength 0.2% |  |  |
| annealed condition | 2.12 times | 3.83 times |
| 20% work hardened | 2.33 times | 5.00 times |
| 40% work hardened | 3.00 times | 5.00 times |

The greater the amount of cold reduction to finished size, the higher the ultimate tensile strength, yield strength, and hardness, but the lower the elongation (ductility). The 40%-work-hardened condition represents the highest tensile properties generally commercially obtainable with most metals by cold reduction. In the case of the austenitic stainless steels, a stress-relief heat treatment at 370° C. has the effect of slightly increasing the yield strength and ductility, but with little or no change in ultimate tensile strength or hardness. In the 40%-work-hardened and 370° C.-stress-relieved condition, the UNS S31600 (Type 316) alloy has a hardness of Rockwell C 27, corresponding to Brinell 265, Vickers 280, and Knoop 291, and the UNS S20910 alloy a hardness of Rockwell C 43.6, corresponding to Brinell 406, Vickers 431, and Knoop 448. With essentially equal ductility of these two alloys, the higher hardness of UNS S20910 is a significant advantage in surface-finishing operations.

Another interesting high-strength corrosion-resistant alloy is the precipitation-hardening austenitic stainless steel UNS S66286. Since strengthening austenitic stainless steels by solid-solution alloying and work hardening has its limits, there is another means available whereby, with appropriate alloy compositional design, strengthening by precipitation hardening can also occur. In UNS S66286, the primary precipitate is the ordered face-centered-cubic austenitic phase $(Al,Ti)Ni_3$, but secondary precipitates of other phases may also form during the heat treatment at 550° to 750° C. These precipitate phases are dispersed within the grains of the main (i.e., matrix) austenitic phase and are so very fine that they cannot be resolved in a light microscope and require an electron microscope to be seen. Completely single-phase austenitic UNS S66286 with all alloying elements in solid solution is obtained by annealing at 900° to 980° C. to the solution-treated condition. During cold working, solution-treated UNS S66286 has a work-hardening rate the same as that of Type 310 (UNS S31000) and similar to that of Type 316 (UNS S31600) austenitic stainless steels. The strength of the UNS S66286 alloy can be substantially increased by heat treating either the solution-treated or the solution-treated and subsequently cold-worked material. In the latter case, the precipitation hardening results in a further increase in strength and hardness in comparison with the former. The optimum temperature for precipitation hardening varies with the amount of cold work, from 700° C. for the annealed solution-treated condition, to 625° C. for the subsequently 20%-work-hardened condition, and to 610° C. for the subsequently 40%-work-hardened condition. Furthermore, UNS S66286, because of its very high austenitic stability, remains completely nonmagnetic (actually, paramagnetic) after severe cold work, after precipitation hardening, and after combinations thereof.

The precipitation-hardening austenitic stainless steel UNS S66286 was developed by and is available from Allegheny Ludlum Steel Corporation, and is marketed by Allegheny Ludlum as Altemp A-286 stainless steel. Other companies such as ALTech Specialty Steel Corporation, Carpenter Technology Corporation, Crucible Materials Corporation, and Inco Alloys International sell UNS S66286 as A-286 stainless steel. UNS S66286 is defined as having a composition that includes substantially 0.08% C, 2.0% Mn, 1.00% Si, 13.5–16.0% Cr, 14.0–27.0% Ni, 0.04% P, 0.03% S, 0.35% Al, 0.001–0.010% B, 1.00–1.50% Mo, 1.90–2.35% Ti, 0.10–0.50% V. [Source: "Metals Handbook Desk Reference", ASM International].

The following comparison chart for some physical and mechanical properties of austenitic stainless steel UNS S31600 (Type 316) and precipitation-hardening austenitic stainless steel UNS S66286 shows that the latter when precipitation hardened has a significant advantage in strength over the former. Essentially, UNS S66286 combines the best features of UNS S31000 (Type 310) and UNS S31600 (Type 316), and can when precipitation hardened match or even exceed the strengths attained in work-hardened UNS S30100 (Type 301) and UNS S20910. In terms of strength and stability at higher temperatures, UNS S66286 is unexcelled among austenitic stainless steels.

TABLE 4

Comparison of some physical and mechanical properties of austenitic stainless steel UNS S31600 (Type 316) and precipitation-hardening austenitic stainless steel UNS S66286

|  | UNS S31600 (Type 316) | UNS S66286 prior to precipitation | UNS S66286 after hardening |
|---|---|---|---|
| Density | 7.95 g/cm³ | 7.92 g/cm³ | 7.94 g/cm³ |
| Electrical resistivity | 74 μohm cm | 91 μohm cm | |
| Thermal-expansion coefficient | | | |
| (20 to 100° C.) | 16.0 × 10⁻⁶ cm/cm/°C. | 16.5 × 10⁻⁶ cm/cm/°C. | |
| (0 to 650° C.) | 18.5 × 10⁻⁶ cm/cm/°C. | 17.8 × 10⁻⁶ cm/cm/°C. | |
| Melting point range | 1370 to 1400° C. | 1370 to 1430° C. | |
| Modulus of elasticity (Young's) | 28,000 kpsi 193 GPa | 29,100 kpsi 201 GPa | 29,100 kpsi 201 GPa |
| Ultimate tensile strength | | | |
| annealed | 82,000 psi 565 MPa | 90,000 psi 620 MPa | 130,000 psi 896 MPa |
| 20% work hardened | 113,000 psi 779 MPa | 111,000 psi 765 MPa | 173,500 psi 1196 MPa |
| 40% work hardened | 150,000 psi 1034 MPa | 135,000 psi 931 MPa | 205,000 psi 1413 MPa |
| Yield strength 0.2% | | | |
| annealed | 36,000 psi 248 MPa | 40,000 psi 275 MPa | 85,000 psi 586 MPa |
| 20% work hardened | 70,000 psi 483 MPa | 92,000 psi 634 MPa | 150,000 psi 1034 MPa |
| 40% work hardened | 111,000 psi 765 MPa | 128,000 psi 883 MPa | 185,000 psi 1276 MPa |

The following ratio-comparison chart for some physical and mechanical properties of the precipitation-hardening austenitic stainless steel UNS S66286 prior to and after precipitation hardening, each with respect to those of the 5086 aluminum alloy (UNS A95086), clearly illustrates the high-strength advantage of the precipitation-hardened condition for the steel.

TABLE 5

Ratio property comparison of precipitation-hardening austenitic stainless steel UNS S66286 prior to and after precipitation hardening, each with respect to 5086 aluminum alloy (UNS A95086)

|  | Prior to Precipitation | After Hardening |
|---|---|---|
| Density | 2.98 times | 2.98 times |
| Electrical resistivity (20° C.) | 16.61 times | 16.61 times |
| Thermal-expansion coefficient (20 to 100° C.) | 0.69 times | 0.69 times |
| Modulus of elasticity (Young's) | 2.83 times | 2.83 times |
| Ultimate tensile strength | | |
| annealed condition | 2.37 times | 3.42 times |
| 20% work hardened | 2.64 times | 4.13 times |
| 40% work hardened | 2.87 times | 4.36 times |
| Yield strength 0.2% | | |
| annealed condition | 2.35 times | 5.00 times |
| 20% work hardened | 3.07 times | 5.00 times |
| 40% work hardened | 3.46 times | 5.00 times |

Where 5086 aluminum alloy (UNS A95086) is now used for a disk substrate, the UNS S20910 austenitic stainless steel or the UNS S66286 precipitation-hardening austenitic stainless steel in the precipitation-hardened condition, with their advantage of higher strength-to-density ratio, could be used. For a 0.050"-thickness disk substrate, 95 mm (3.740") diameter, of 5086 aluminum alloy, an 0.018"-thickness disk substrate 11 of UNS S20910 or UNS S66286 could be used, resulting in the same weight for the disk substrate.

Stainless steel strip over the thickness range required for disk substrates can be precision cold rolled to a tolerance of better than ±0.0001" (±0.0025 mm) on modern (or modernized) Sendzimir Type 1-2-3-4 twenty-high roll-cluster mills. In this mill, the two work rolls have the smallest practical diameter, each of which is backed by two intermediate rolls, and each of these pairs is backed by three larger-diameter rolls, where in turn each set is backed by four high-capacity bearing assemblies, all mounted in a rugged one-piece cast housing. The extreme rigidity and supporting structure of this mill arrangement minimizes work-roll deflection in the horizontal plane as well as bending in the vertical plane. The small-diameter work rolls in the reversing mill permit at high speeds the greatest overall (i.e., with a few passes back and forth) thickness reductions between anneals, easily by 40% with up to 75% being possible. Strip of extremely close thickness tolerance both across the width and along the length is possible with a Sendzimir mill when equipped with an automatic anticipatory gauge-control system which continuously electronically scans and compares the entry and exit strip across the width, and which signals a servomechanism controlling the electro-hydraulic screwdown positioning system for adjusting the mill cluster rolls. A computer controlling these systems also controls a tensiometer-mechanism system to provide constant winder tension and a motor-drive system to provide constant mill speed, plus other compensating adjustment systems. For the finishing pass of the strip in a reversing mill, the easily removable work rolls may be exchanged for ones that are highly polished to a mirror finish. In this way a strip product with a mirror-bright surface finish down to less than one micro-inch can be obtained. Furthermore, a precision rolling mill can be equipped with an inline tension leveler combining stretcher and roller leveling in a single operation to literally stretch the metal strip to ultraflatness.

A method of fabricating the disk substrates from the austenitic stainless steel strip is chosen that will not distort and deform the part in cutting the disk outside and inside diameters. Conventional stamping of metals entailing a blanking, punching, and shearing operation typically does not provide the required precision for magnetic-recording disks. The required precision can be met by a forming operation known as precision blanking, and similarly fine-blanking, wherein a high-speed hydraulic punch press, with very little clearance between the punch and die (less than one-half percent of the piece-part material thickness) and having a dull punch tool edge instead of the usual sharp one, is employed. The part, being clamped and confined within the die cavity, is cold extruded out of the strip instead of sheared and fractured away. The resulting parts have smooth straight sides with no taper or die break.

Alternatively, an electromagnetic-driven very-high-velocity impact punch press, with a precision die set having near-zero clearance between the punch and die, can blank parts with smooth straight sides and with sharp burr-free edges and without any die roll. In the usual punching operation, the workpiece undergoes three stages: elastic, plastic, and fracture. Very-high-velocity impact punch pressing bypasses the elastic and plastic stages and causes the fracture stage to take place so rapidly that the metal workpiece does not have time to react, and rolled edges and burrs do not have time to form. This electromagnetic-driven very-high-velocity impact punch press has been designed at Lourdes Systems, Inc., Hauppauge, Long Island, New York.

Marring of the surface finish on the precision-rolled strip caused from the contact by the punch tool and die cavity can be prevented by the use of a strippable plastic coating or adhesive-backed paper on the strip.

These precision-blanking procedures are the least-expensive fabrication methods for cutting the disk substrates from precision-rolled strip. Computer-numerical-controlled laser machining to perform the task of precision cutting to finished dimension can also be utilized. Alternatively, abrasive water-jet cutting with recent improvements in its precision can be employed.

The disk substrates blanked or cut from precision coldrolled strip would require a very minimal lapping step, the smoother the surface finish the smaller the amount of lapping, and a finishing polishing step. A double-sided planetary lapping and polishing machine is the preferred approach for this operation.

The austenitic stainless steels are the easiest metals to further surface finish by electrolytic polishing (also called electropolishing). A high polish is produced by making the part the anode in an electrolytic cell, where preferential dissolution at high points smooths the surface and at sharp edges rounds these corners. Small burrs, too, are readily removed.

Electrolytes used for stainless steels include: 1) a mixture of appropriate concentrations of phosphoric acid ($H_3PO_4$) and sulfuric acid ($H_2SO_4$) together with glycerol (1,2,3-propanetriol) ($HOCH_2CHOHCH_2OH$), and 2) a mixture of appropriate concentrations of chromic acid ($H_2CrO_4$ or $H_2Cr_2O_7$) and acetic acid (ethanoic acid) ($CH_3COOH$).

A low-voltage (typically 1.0 to 2.0 V) dc electrical current is applied across the cell. At the anode the current density is highest at the high points of the surface irregularities and thus these areas are removed at a greater rate than that at the depressions. This process results in the simultaneous smoothing, leveling, and brightening of the surface. Being an anodic process, oxygen is liberated at the anode and thus the stainless steel becomes fully passivated also, imparting a maximum resistance to attack and corrosion. The finer the surface finish obtained by rolling, machining, or mechanical polishing, the finer is the surface finish resulting from electropolishing. The use of electropolishing for burr removal and surface microfinishing has the further advantage that there is absolutely no distortion, deformation, or damage incurred by the part. Furthermore, since burr removal, edge rounding, surface microsmoothing, and passivating are performed simultaneously, cost savings are realized over conventional methods.

From the above description, it will be apparent that the invention disclosed herein provides a novel and advantageous magnetic-recording substrate composed of austenitic stainless steel. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A magnetic-recording disk comprising:
   a rigid disk-shaped substrate composed of an austenitic stainless steel; and
   a thin-film coating of a magnetic-recording material overlying a surface of the substrate, wherein the magnetic-recording material is composed of a ferromagnetic or ferrimagnetic material and is capable of being magnetized by application of an external magnetic field.

2. A magnetic-recording disk as recited in claim 1 wherein the coating of magnetic-recording material is applied to the substrate by sputter deposition.

3. A magnetic-recording disk as recited in claim 1 wherein the substrate is precision blanked from flat precision coldrolled austenitic stainless steel.

4. A magnetic-recording disk as recited in claim 1 wherein the substrate is an austenitic stainless steel having a composition that includes substantially 0.06% C, 4.0–6.0% Mn, 1.00% Si, 20.5–23.5% Cr, 11.5–13.5% Ni, 0.04% P, 0.03% S, 1.5–3.0% Mo, 0.2–0.4% N, 0.1–0.3% Nb, and 0.1–0.3% V.

5. A magnetic-recording disk as recited in claim 1 wherein the substrate is a precipitation-hardening austenitic stainless steel having a composition that includes substantially 0.08% C, 2.0% Mn, 1.00% Si, 13.5–16.0% Cr, 14.0–27.0% Ni, 0.04% P, 0.03% S, 0.35% Al, 0.001–0.010% B, 1.00–1.50% Mo, 1.90–2.35% Ti, 0.10–0.50% V.

6. A magnetic-recording disk as recited in claim 1 wherein the substrate includes a surface hardened by plasma nitriding, plasma carburizing, or plasma carbonitriding.

7. A magnetic-recording disk as recited in claim 1 further including a hard material coating on a surface of the substrate, wherein the hard material coating is aluminum nitride, silicon nitride, silicon carbide, or a nitride, carbide, or boride of a metal selected from the group consisting of titanium, zirconium, hafnium, vanadium, niobium, tantalum, chromium, molybdenum, and tungsten, and is applied prior to the application of the magnetic-recording material.

8. A magnetic-recording disk as recited in claim 7 wherein the hard material coating is applied to the substrate by evaporative reactive ion plating or reactive sputtering.

9. A magnetic-recording disk as recited in claim 1 wherein the substrate includes a surface hardened by plasma nitriding, plasma carburizing, or plasma carbonitriding, and wherein the disk further includes a hard material coating of aluminum nitride, silicon nitride, silicon carbide, or a nitride, carbide, or boride of a metal selected from the group consisting of titanium, zirconium, hafnium, vanadium, niobium, tantalum, chromium, molybdenum, and tungsten and is applied by evaporative reactive ion plating or reactive sputtering prior to the application of the magnetic-recording material.

10. A magnetic-recording disk as recited in claim 7 wherein the hard material coating has a thickness of between 0.5 micrometers and 1.0 micrometers.

11. A magnetic-recording disk as recited in claim 9 wherein the hard material coating has a thickness of between 0.5 micrometers and 1.0 micrometers.

12. A coated substrate for a magnetic-recording disk comprising:
- a rigid disk-shaped uncoated substrate composed of an austenitic stainless steel;
- a coating on a surface of the substrate, wherein the coating is aluminum nitride, silicon nitride, silicon carbide, or a nitride, carbide, or boride of a metal selected from the group consisting of titanium, zirconium, hafnium, vanadium, niobium, tantalum, chromium, molybdenum, and tungsten; and
- an interfacial diffusion of the coating into the substrate that results in adhesion of the coating to the substrate.

13. A coated substrate as recited in claim 12 wherein the coating is characterized by an energetic-atom-deposited dense fibrous Zone T structure.

* * * * *